United States Patent
Ackerman et al.

(10) Patent No.: US 6,905,730 B2
(45) Date of Patent: Jun. 14, 2005

(54) ALUMINIDE COATING OF TURBINE ENGINE COMPONENT

(75) Inventors: John Frederick Ackerman, Laramie, WY (US); Michael James Weimer, Loveland, OH (US); Joseph Aloysius Heaney, Middletown, OH (US); William Scott Walston, Mason, OH (US); Bangalore Aswatha Nagaraj, West Chester, OH (US)

(73) Assignee: General Electric Company, Schenectady, NY (US)

( * ) Notice: Subject to any disclaimer, the term of this patent is extended or adjusted under 35 U.S.C. 154(b) by 22 days.

(21) Appl. No.: 10/615,094

(22) Filed: Jul. 8, 2003

(65) Prior Publication Data

US 2005/0008780 A1 Jan. 13, 2005

(51) Int. Cl.$^7$ .............................................. C23C 16/20
(52) U.S. Cl. ............... 427/252; 427/255.26; 427/255.4; 427/383.1; 427/383.7
(58) Field of Search ........................... 427/252, 255.26, 427/255.4, 383.1, 383.7

(56) References Cited

U.S. PATENT DOCUMENTS

| | | | | |
|---|---|---|---|---|
| 4,031,274 A | * | 6/1977 | Bessen | ........................ 148/527 |
| 4,132,816 A | | 1/1979 | Benden et al. | |
| 4,148,275 A | | 4/1979 | Benden et al. | |

OTHER PUBLICATIONS

U.S. Appl. No. 10/199,185, filed Jul. 19, 2002, Ackerman et al.
U.S. Appl. No. 10/357,987, filed Feb. 4, 2003, Wustman et al.
U.S. Appl. No. 10/357,972, filed Feb. 4, 2003, Wustman et al.

*Primary Examiner*—Timothy Meeks
(74) *Attorney, Agent, or Firm*—Donald E. Hasse; Hasse & Nesbitt LLC

(57) ABSTRACT

A method for forming an aluminide coating on a turbine engine component having an external surface and an internal cavity defined by an internal surface that is connected to the external surface by at least one hole. The method is conducted in a vapor coating container having a hollow interior coating chamber, and includes the steps of loading the coating chamber with the component to be coated; flowing a tri-alkyl aluminum coating gas into the loaded coating chamber at a specified temperature, pressure, and time to deposit an aluminum coating on the external and internal surfaces of the component; and heating the component in a nonoxidizing atmosphere at a specified temperature and time to form an aluminide coating on the external and internal surfaces. The coated component is typically then maintained at an elevated temperature in the presence of oxygen to form an oxide coating on the external and internal surfaces of the component. In one embodiment, the turbine engine component is a turbine engine blade having an external surface and an internal cooling cavity having an internal surface that is connected to the external surface by cooling holes.

29 Claims, 3 Drawing Sheets

U.S. PATENT DOCUMENTS

| | | | |
|---|---|---|---|
| 4,332,843 A | 6/1982 | Ahuja | |
| 4,714,624 A | 12/1987 | Naik | |
| 5,221,354 A | 6/1993 | Rigney | |
| 5,264,245 A | 11/1993 | Punola et al. | |
| 5,292,594 A | 3/1994 | Liburdi et al. | |
| 5,407,704 A | 4/1995 | Basta et al. | |
| 5,494,704 A | 2/1996 | Ackerman | |
| 5,503,874 A | 4/1996 | Ackerman et al. | |
| 5,693,368 A | 12/1997 | Ackerman et al. | |
| 5,780,106 A * | 7/1998 | Conner | 427/250 |
| 5,856,027 A * | 1/1999 | Murphy | 428/623 |
| 5,928,725 A | 7/1999 | Howard et al. | |
| 6,039,810 A | 3/2000 | Mantkowski et al. | |
| 6,203,851 B1 | 3/2001 | Walter | |
| 6,207,233 B1 | 3/2001 | Perry et al. | |
| 6,224,941 B1 | 5/2001 | Chen et al. | |
| 6,273,678 B1 | 8/2001 | Darolia | |
| 6,283,714 B1 | 9/2001 | Rigney et al. | |
| 6,296,447 B1 | 10/2001 | Rigney et al. | |
| 6,332,926 B1 | 12/2001 | Pfaendtner et al. | |
| 6,413,584 B1 | 7/2002 | Wustman et al. | |
| 6,434,876 B1 | 8/2002 | Wheat et al. | |
| 6,485,262 B1 | 11/2002 | Heyward et al. | |
| 2001/0055650 A1 | 12/2001 | Pfaendtner et al. | |

* cited by examiner

US 6,905,730 B2

ALUMINIDE COATING OF TURBINE ENGINE COMPONENT

BACKGROUND OF THE INVENTION

The present invention relates to a method for forming a protective coating on a turbine engine component having an external surface and an internal cavity defined by an internal surface connected to the external surface by at least one hole. More particularly, the invention relates to forming an aluminide coating on the internal and external surfaces of a turbine component, such as a turbine blade having an internal cooling cavity.

In an aircraft gas turbine engine, air is drawn into the front of the engine, compressed by a shaft-mounted compressor, and mixed with fuel. The mixture is burned, and the hot exhaust gases are passed through a turbine mounted on the same shaft. The flow of combustion gas turns the turbine by impingement against the airfoil section of the turbine blades, which turns the shaft and provides power to the compressor. (As used herein, the term turbine blade may refer to either a turbine blade or a turbine vane, which have similar appearance in pertinent portions.) The hot exhaust gases flow from the back of the engine, driving it and the aircraft forward.

The hotter the combustion and exhaust gases, the more efficient is the operation of the jet engine. The maximum temperature of the combustion gases is normally limited by the materials used to fabricate the turbine blades. In current engines, the turbine blades are made of nickel-based superalloys, and can operate at metal temperatures of up to about 1900–2100° F. (about 1038–1149° C.).

Turbine blades typically comprise cooling circuits that channel cooling air through the interior of the turbine airfoil to reduce temperatures encountered by the blade and improve part life. During operation of the jet engine, air is forced through the root portion of the blade, into the airfoil cooling chambers, and out openings at the external surface of the airfoil. The flow of the air removes heat from the interior of the airfoil and, in some cases, providing a boundary layer of cooler air at the surface of the airfoil. In at least some known blades, an abrupt transition extends between the root portion and the airfoil portion to increase the volume of cooling air entering the airfoil portion.

Gas turbine blades frequently have metallic surface coatings that are capable of resisting the oxidation, corrosion and sulfidation conditions generated during high temperature operation. Such coatings facilitate the airfoil withstanding thermal stresses that may be induced within the higher operating temperature areas of the blade. However, if the coating is applied at too great a thickness on regions of the blade operating at lower temperatures, such as the root and shank region, the combination of the increased coating thickness and the abrupt transition within the dovetail may cause cracking in the root portion as higher stresses are induced into the transition area of the dovetail. Over time, continued operation may lead to a premature failure of the blade within the engine.

The above coatings can be applied by depositing a vapor of one or more protective metals, for example aluminum or alloys of aluminum, on blade surfaces at high temperatures within a coating container or chamber commonly referred to as a "retort". Generally, the blades to be coated are placed within the container, along with a source of the aluminide coating, typically in the form of metallic pellets retained in perforated baskets arranged in rows surrounding the blades. The coating container is then placed within a heater such as a furnace to generate an aluminide coating vapor. Generation of the coating vapor typically includes the use of halide "activators" such as fluorides, chlorides or bromides. The halide activator can be in the form of a gas that is introduced into the container to react with the source of the aluminide coating and form an aluminide-bearing gas, or it can be generated from a halide activator source within the container that forms a reactive halide gas upon heating.

While the above processes can be used to form an aluminide coating on the exterior and interior surfaces of turbine blades, processes using halide containing vapors at high deposition temperatures can be expensive and difficult to control, and may result in distortion of the blades, grain growth, creep and other thermo-mechanical failure mechanisms that can decrease the strength and life of the blade. Accordingly, it is desirable to provide a low-temperature, low-cost process to form a controlled, relatively uniform aluminide coating on the external and internal surfaces of turbine blades and other turbine components. It is also desirable that the aluminide coating formed on internal surfaces of turbine blades, particularly in the root and shank region, be relatively thin (for example, having a thickness of from about 0.0005 to about 0.0015 inches) (from about 12.7 to about 38.1 microns) so as not to cause premature cracking in the root portion of the blade.

BRIEF DESCRIPTION OF THE INVENTION

In one aspect, this invention relates to a method for forming an aluminide coating on a turbine engine component having an external surface and an internal cavity defined by an internal surface that is connected to the external surface by at least one hole, the method being conducted in a vapor coating container having a hollow interior coating chamber, the method comprising the steps of:

(a) loading the coating chamber with the component to be coated;

(b) heating the loaded coating chamber to a temperature of from about 240° C. to about 450° C.;

(c) flowing a tri-alkyl aluminum coating gas into the heated coating chamber at a pressure of from about 50 to about 2000 mtorr (about 0.68 to about 27 kgf/m$^2$) for from about 0.25 to about 4 hours to deposit an aluminum coating on the external and internal surfaces of the component; and then (d) heating the coated component in a nonoxidizing atmosphere to a temperature of from about 500° C. to about 1100° C. to form an aluminide coating on the external and internal surfaces of the component.

In another aspect, this invention relates to a method as described above for forming an aluminide coating on a turbine engine blade having an external surface and an internal cooling cavity defined by an internal surface that is connected to the external surface by cooling holes, wherein the aluminide coating has a thickness of from about 0.0015 to about 0.003 inches (from about 38.1 to about 76.2 microns) on the external surface of the blade in the airfoil body portion, and has a thickness of from about 0.0005 to about 0.0015 inches (from about 12.7 to about 38.1 microns) on the internal surface of the blade.

In one embodiment, the invention relates to a method for forming an aluminide coating on a turbine engine blade having an external surface and an internal cooling cavity defined by an internal surface that is connected to the external surface by cooling holes, the method being conducted in a vapor coating container having a hollow interior coating chamber, the method comprising the steps of:

(a) loading the coating chamber with the blade to be coated;
(b) heating the loaded coating chamber to a temperature of from about 250° C. to about 300° C.;
(c) flowing a tri-$C_2$–$C_5$ alkyl aluminum coating gas into the heated coating chamber at a pressure of from about 450 to about 550 mtorr (about 6.1 to about 7.5 kgf/m$^2$) for from about 0.5 to about 2 hours to deposit an aluminum coating on the external and internal surfaces of the blade;
(d) heating the coated blade in a vacuum to a temperature of from about 640° C. to about 700° C. to form an aluminide coating on the external and internal surfaces of the blade; and then
(e) maintaining the blade at a temperature of from about 600° C. to about 800° C. in the presence of oxygen to form an oxide coating on the external and internal surfaces of the blade.

DETAILED DESCRIPTION OF THE INVENTION

Figure 1:
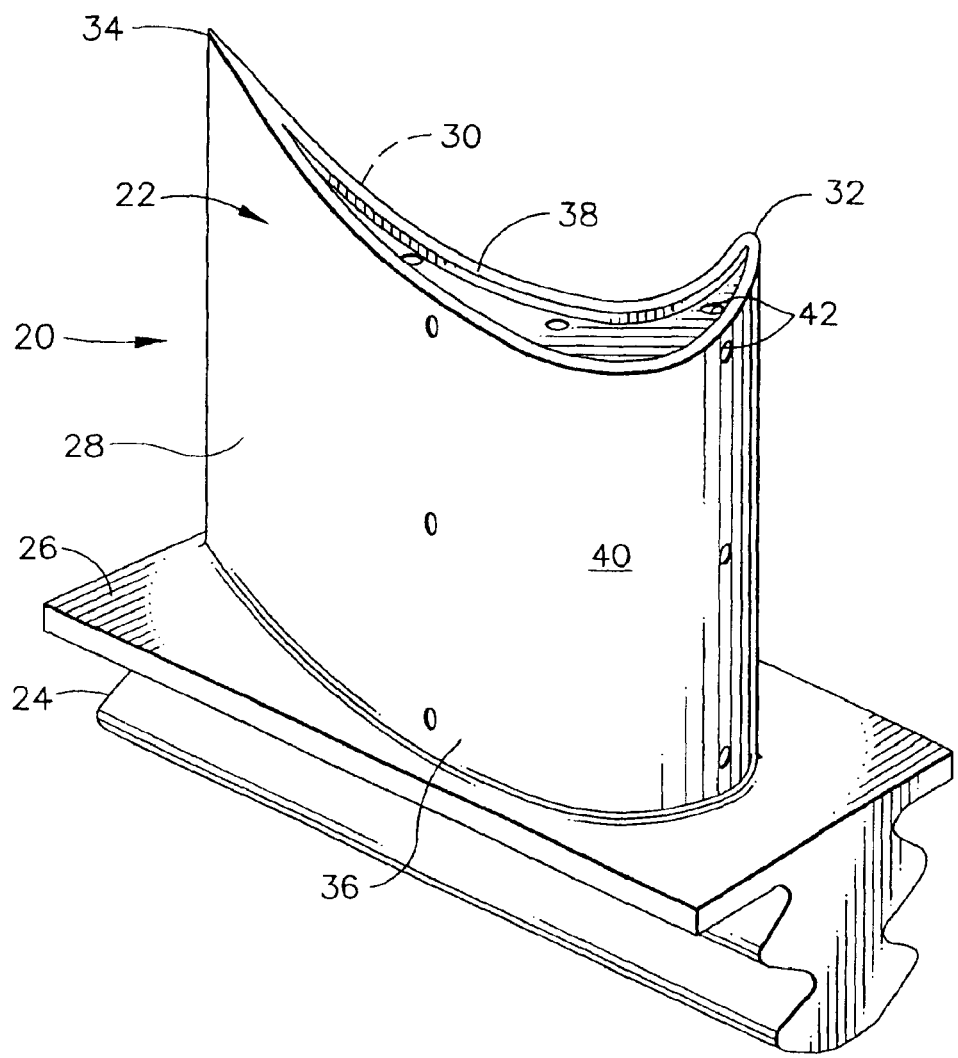
FIG. 1 is a perspective view of a turbine engine blade.

Referring to the drawings, FIG. 1 depicts a turbine blade 20 of a gas turbine engine. Turbine blade 20 may be formed of any operable material, but typically is a nickel-base or cobalt-base superalloy. Blade 20 includes an airfoil 22 against which the flow of hot exhaust gas is directed. Blade 20 is mounted to a turbine disk (not shown) by a dovetail 24 that extends downwardly from the airfoil 22 and engages a slot on the turbine disk. A platform 26 extends longitudinally outwardly from the area where the airfoil 22 is joined to the dovetail 24.

Airfoil 22 includes a first sidewall 28 and a second sidewall 30. First sidewall 28 is convex and defines a suction side of airfoil 22, and second sidewall 30 is concave and defines a pressure side of airfoil 22. Sidewalls 28 and 30 are joined at a leading edge 32 and at an axially-spaced trailing edge 34 of airfoil 22. Airfoil trailing edge 34 is spaced chordwise and downstream from airfoil leading edge 32. First and second sidewalls 28 and 30, respectively, extend longitudinally or radially outward in span from an airfoil root 36 positioned adjacent dovetail 24, to an oppositely disposed airfoil tip 38 remote from dovetail 24. Airfoil tip 38 defines a radially outer boundary of an internal cooling cavity (not shown in FIG. 1). The cooling cavity is bounded within airfoil 22 between sidewalls 28 and 30. More specifically, blade 20 includes an internal surface (not shown in FIG. 1) and an external surface 40, and the cooling cavity is defined by the blade internal surface. In one embodiment, a number of internal cooling chambers extend through the interior of airfoil 22, between airfoil first and second sidewalls 28 and 30, respectively, ending in a plurality of cooling holes 42 extending between the airfoil internal surface and airfoil external surface 40. During operation of the gas turbine engine, a flow of cooling air is directed through the internal cooling chambers to reduce the temperature of the airfoil 22.

Figure 2:
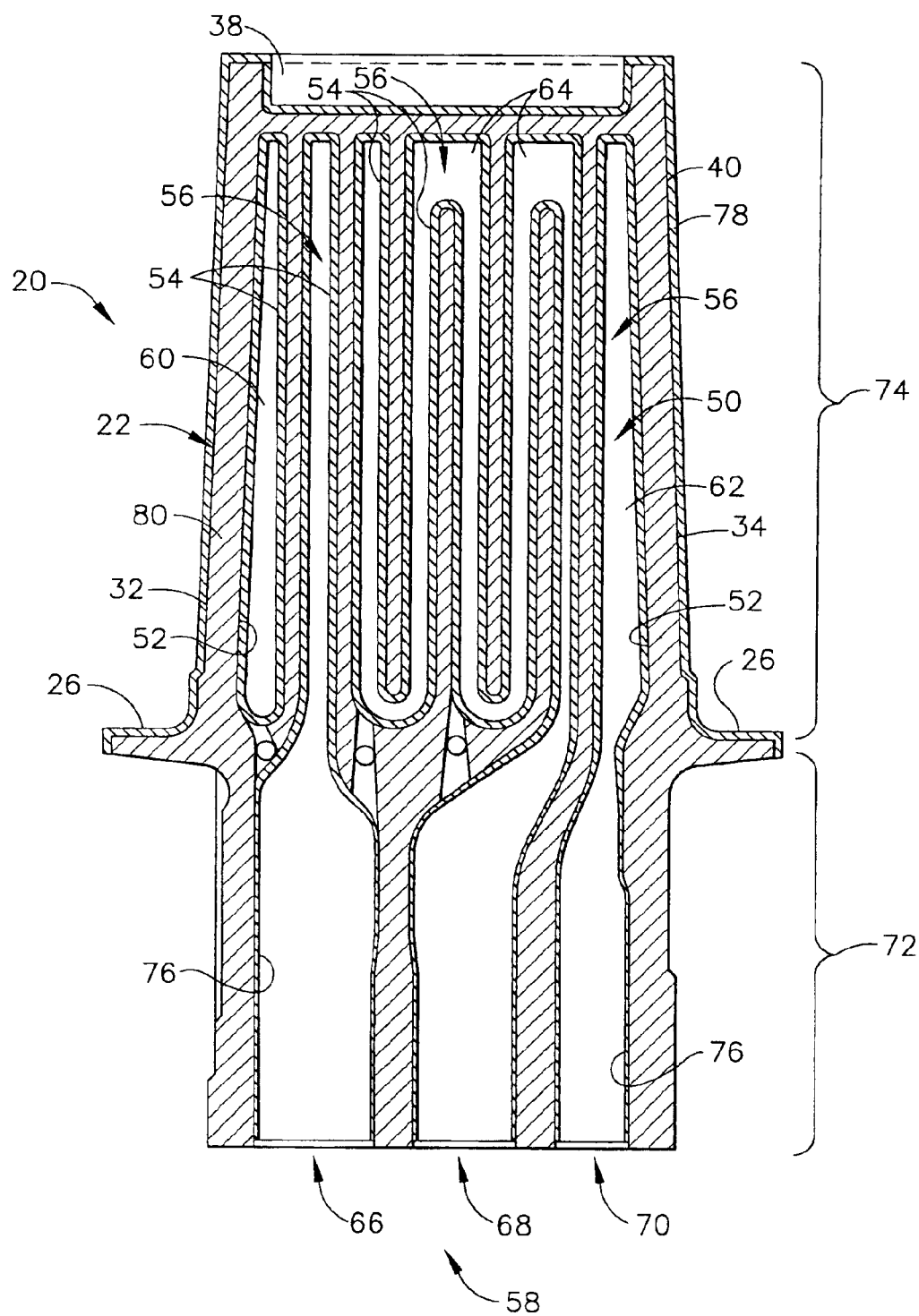
FIG. 2 is an exemplary cross-sectional view of the turbine blade shown in FIG. 1.

FIG. 2 is an exemplary cross-sectional view of blade 20 including airfoil 22. Blade 20 includes a cooling cavity 50 defined by an internal surface 52 of blade 20. Cooling cavity 50 includes a plurality of inner walls 54 that separate cooling cavity 50 into a plurality of cooling chambers 56. The geometry and interrelationship of chambers 56 to walls 54 varies with the intended use of blade 20. In one embodiment, inner walls 54 are cast integrally with airfoil 22. Cooling chambers 56 are supplied cooling air through a plurality of cooling circuits 58. More specifically, in the exemplary embodiment, airfoil 22 includes a forward cooling chamber 60, an aft cooling chamber 62, and a plurality of mid cooling chambers 64.

Forward cooling chamber 60 extends longitudinally or radially through airfoil 22 to airfoil tip 38, and is bordered by airfoil first and second sidewalls 28 and 30, respectively (shown in FIG. 1), and by airfoil leading edge 32. Forward cooling chamber 60 is cooled with cooling air supplied by a forward cooling circuit 66, which cooling air is fed through cross-over holes (not shown) in the inner wall 54 on the trailing edge side of forward cooling chamber 60.

Mid cooling chambers 64 are between forward cooling chamber 60 and aft cooling chamber 62, and are supplied cooling air by a mid cooling circuit 68. More specifically, mid cooling chambers 64 are in flow communication and form a serpentine cooling passageway. Mid cooling chambers 64 are bordered by airfoil first and second sidewalls 28 and 30, respectively (shown in FIG. 1), and by airfoil tip 38.

Aft cooling chamber 62 extends longitudinally or radially through airfoil 22 to airfoil tip 38, and is bordered by airfoil first and second sidewalls 28 and 30, respectively (shown in FIG. 1), and by airfoil trailing edge 34. Aft cooling chamber 62 is cooled with cooling air supplied by an aft cooling circuit 70 that defines a radially outer boundary of aft cooling chamber 62. In one embodiment, airfoil 22 includes a plurality of trailing edge openings (not shown) that extend between external surface 40 and internal surface 52.

Blade 20 also includes a root portion 72 and an airfoil body portion 74. Root portion 72 is bounded by airfoil root 36 (shown in FIG. 1) and extends through a portion of dovetail 24 (shown in FIG. 1). Airfoil body portion 74 is in flow communication with root portion 72 and extends from root portion 72 to airfoil tip 38. In one embodiment, portions of cooling cavity 50 extending through root portion 72 are known as root passages.

Blade internal surface 52 is coated with a layer of an aluminide coating 76. The aluminide coating is formed by depositing aluminum onto the internal surface 52, so that a body of blade 20 serves as a substrate 80, by a vapor phase deposition process. The aluminide coating may be modified with elements such as hafnium, zirconium, yttrium, silicon, titanium, tantalum, cobalt, chromium, platinum, and palladium, and combinations thereof, to improve its corrosion resistance and other properties. The aluminum (and modifying elements, if any) is interdiffused with the material of the substrate 80 to form the aluminide coating 76 on the internal surface 52. The aluminide coating 76 has a composition with the aluminum concentration highest near the internal surface 52, and decreasing aluminum concentration with increasing distance into the substrate 80 from the internal surface 52. More specifically, the thickness of the aluminide coating 76 on internal surface 52 is less than about 0.003 inches (less than about 76.2 microns), typically from about 0.001 inches to about 0.0015 inches (from about 25.4 to about 38.1 microns), within airfoil body portion 74, and less than about 0.0015 inches (less than about 38.1 microns), typically from about 0.0005 to about 0.0015 inches (from about 12.7 to about 38.1 microns), within root portion 72, which operates at a lower temperature in comparison to airfoil body portion 74. In one embodiment, the thickness of the aluminide coating 76 is less than about 0.001 inches (less than about 25.4 microns) within root portion 72. When exposed to a high-temperature oxidizing environment, the aluminum-enriched layer at the internal surface 52 oxidizes to form an adherent aluminum oxide protective scale at the internal surface 52, inhibiting and slowing further oxidation damage.

A layer of aluminide coating 78 is also present on the external surface 40 in the airfoil body portion 74. The aluminide coating is formed by depositing aluminum onto the external surface 40 in the airfoil body portion 74, so that a body of the airfoil 22 serves as a substrate 80, by a vapor phase deposition process. The aluminide coating may be modified with elements such as described above to improve corrosion resistance and other properties. The aluminum (and modifying elements, if any) is interdiffused with the material of the substrate 80 to form the aluminide coating 78 on the external surface 40. The aluminide coating 78 has a composition with the aluminum concentration highest near the external surface 40, and decreasing aluminum concentration with increasing distance into the substrate 80 from the external surface 40. The aluminide coating 78 is typically from about 0.0005 to about 0.004 inches (from about 12.7 to about 101.6 microns) thick, more typically from about 0.0015 to about 0.003 inches (from about 38.1 to about 76.2 microns) thick on external surface 40 in the airfoil body portion 74. When exposed to a high-temperature oxidizing environment, the aluminum-enriched layer at the external surface 40 oxidizes to form an adherent aluminum oxide protective scale at the external surface 40, inhibiting and slowing further oxidation damage.

An overlay protective coating may be deposited overlying and contacting the external surface 40 of the airfoil body portion 74. The protective coating may be of the MCrAlX type known in the art. The protective layer is usually from about 0.003 to about 0.007 inches (from about 76.2 to about 177.8 microns) thick, typically about 0.005 inches (about 127 microns) thick. The protective layer is deposited by any operable technique, such as physical vapor deposition (e.g., sputtering, cathodic arc, ion plasma, electron beam) or thermal spray.

The overall protective coating optionally includes a ceramic layer deposited overlying and contacting the protective layer. The ceramic layer is usually from about 0.003 to about 0.010 inches (from about 76.2 to about 254 microns) thick, typically about 0.005 inches (about 127 microns) thick. The ceramic layer is usually yttria-stabilized zirconia, which is zirconium oxide comprising from about 2 to about 12 weight percent, typically from about 3 to about 8 weight percent, yttrium oxide. It may be deposited by any operable technique, such as physical vapor deposition or thermal spray. Other operable ceramic materials may be used as well.

During engine operation, cooling air is supplied into airfoil 22 through cooling circuits 58. In one embodiment, cooling air is supplied into airfoil 22 from a compressor. Cooling air entering root portion 72 is channeled into cooling chambers 56 and airfoil body portion 74. Because hot combustion gases impinge upon airfoil body portion 74, the operating temperature of airfoil body portion 74 typically increases to a higher temperature than that associated with root portion 72. The aluminide coating facilitates reducing oxidation of external surface 40 and internal surface 52 in the airfoil body portion 74 despite the increased operating temperature.

Furthermore, stresses generated during engine operation may be induced into root portion 72. Limiting the thickness of the aluminide coating to less than about 0.0015 inches (about 38.1 microns) on internal surface 52 within root portion 72 facilitates preventing material degradation and cracking within root portion 72, thereby maintaining the fatigue life of blade 20. More specifically, limiting cracking of the aluminide coating within root portion 72 facilitates maintaining fatigue life within root portion 72, and thus extends the useful life of blade 20.

Figure 3:
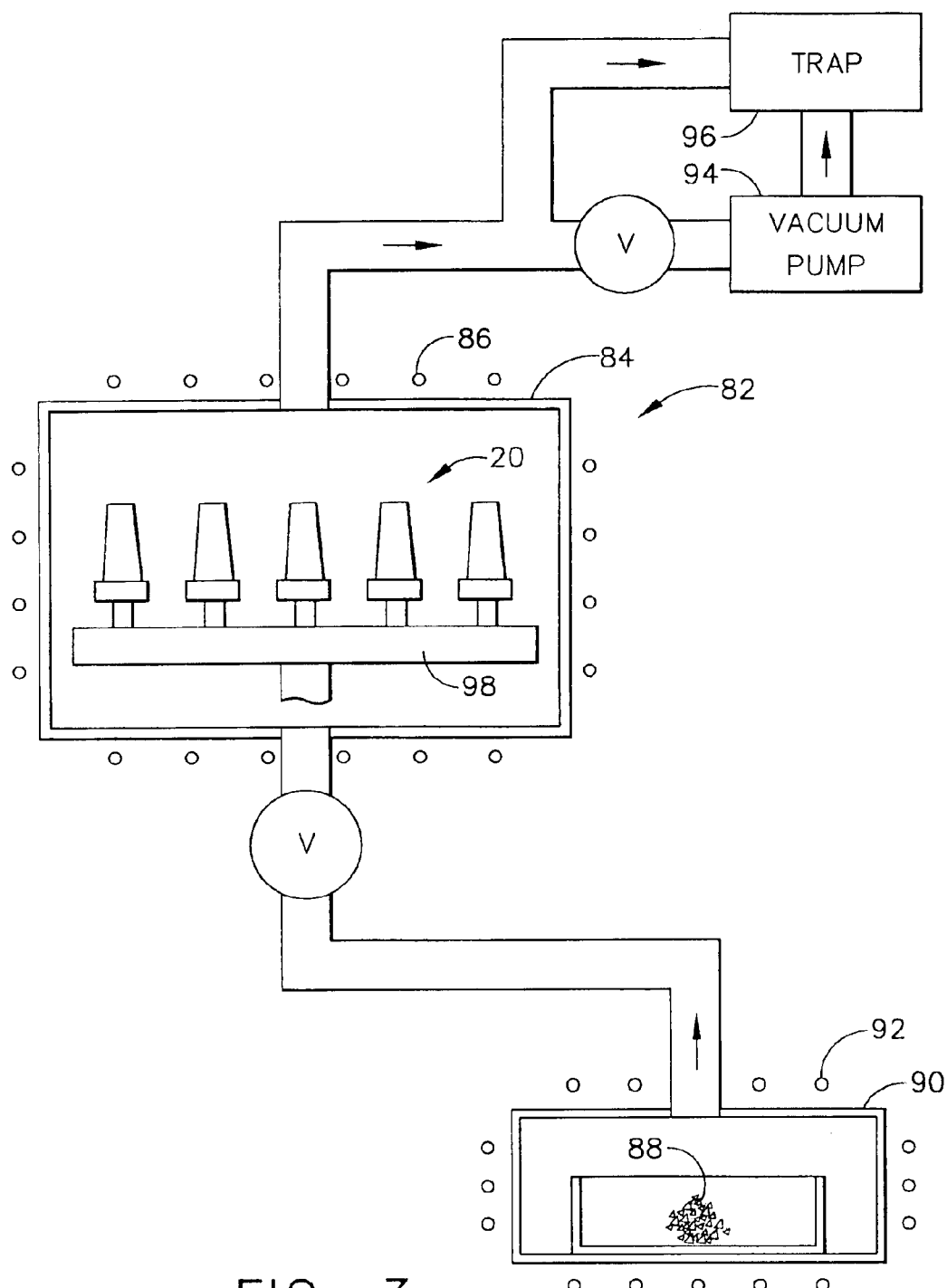
FIG. 3 is a schematic view of an embodiment of a vapor coating apparatus for coating turbine blades such as in FIG. 1.

The aluminide coatings 76 and 78 are formed by depositing an aluminum coating on the external and internal surfaces 40 and 52 of blade 20 using a vapor deposition process, specifically a metal organic chemical vapor deposition (MOCVD) process. FIG. 3 illustrates a vapor coating apparatus 82 in which such an MOCVD process may be performed. The vapor coating apparatus 82 includes a coating container 84 in which multiple turbine blades 20 to be coated are placed. Those portions of the blades that are not to be coated may be masked prior to placement in the coating container 84. The coating container 84 is heated to the desired deposition temperature by appropriate heaters 86, such as resistance elements.

One feature of the MOCVD process herein is that blades 20 upon which aluminide coatings 76 and 78 are formed are heated to a relatively low temperature during the deposition process. The deposition temperature to which the blades are heated in coating container 84 depends upon the material being deposited, but typically is in the range of from about 240° C. to about 450° C., well below the service operating temperature of the blades.

As shown in FIG. 3, the reagents 88 that produce the aluminum deposition vapor are typically placed into a reagent source chamber 90 that is heated by heaters 92. The reagents 88 are organic chemical compounds that produce a tri-alkyl aluminum vapor that transports the aluminum and other optional elements that form the aluminide coatings 76 and 78. In one embodiment, the tri-alkyl aluminum is tri-$C_{2-6}$ alkyl aluminum, typically tri-$C_{3-5}$ alkyl aluminum, e.g., tri-butyl aluminum. N-butyl groups are preferred, although iso-butyl and t-butyl groups may also be used.

The vapor produced from the reagent source chamber 90 flows to the coating container 84 and then around and through the turbine blades 20 to deposit an aluminum coating upon its external and internal surfaces. Another feature of the MOCVD process herein is that it is a non-line-of-sight process. The metal-bearing vapors flow around and through the blades being coated, reaching regions that are not readily accessible by line-of-sight deposition processes.

The deposition is normally conducted in a reduced-pressure environment, so that the coating container 84 is provided as a vacuum chamber. A vacuum pump 94 is provided to evacuate the coating container 84 as needed. A trap 96 traps, filters, and condenses the released organic vapors that are removed from the coating container 84 either directly or by the vacuum pump 94. As shown in FIG. 3, support platform 98 is used to support multiple turbine blades 20 during the vapor deposition process. Some of the aluminum deposition vapor flowing into coating container 84 typically is ducted into the dovetail portions of the blades so that the vapor flows through their internal cooling cavities and out their cooling holes. This reduces the time needed to coat the internal surfaces of the blades.

The thickness of the aluminum coating on the external and internal surfaces of blade 20 is determined in part by the nature of the metal organic vapor, the pressure at which the coating gas is flowed into the coating chamber, the temperature of deposition, and the time of exposure of blade 20 to the metal organic vapor. In one embodiment, the process involves heating the coating chamber containing the blade to be coated to a temperature of from about 240° C. to about 450° C., typically from about 245° C. to about 400° C., more typically from about 250° C. to about 300° C. (e.g., from about 260° C. to about 280° C.). A tri-alkyl aluminum coating gas is then flowed into the loaded coating chamber at a pressure of from about 50 to about 2000 mtorr (about 0.68 to about 27 kgf/m$^2$), typically from about 100 to about 1500 mtorr (about 1.4 to about 20.4 kgf/m$^2$), more typically from about 250 to about 700 mtorr (about 3.4 to about 9.5 kgf/m$^2$), e.g., from about 450 to about 550 mtorr (about 6.1 to about 7.5 kgf/m$^2$), for from about 0.25 to about 4 hours, typically from about 0.5 to about 2 hours, more typically from about 0.75 to about 1.5 hours, while maintaining the loaded coating chamber at the above temperature range, to deposit an aluminum coating on the external and internal surfaces of the blade. Under the above conditions, the aluminum coating is deposited at a rate of from about 0.1 to about 10 microns per hour, typically from about 0.5 to about 5 microns per hour, and more typically from about 1 to about 2 microns per hour. The aluminum coating may contain minor amounts of other metals as described above, buy typically is at least substantially pure, and often is pure aluminum.

The coated blade is then heated in a nonoxidizing atmosphere, e.g., a gas such as hydrogen, nitrogen, helium or argon, and typically in a vacuum, in coating container 84 to a temperature of from about 500° C. to about 1100° C., typically from about 600° C. to about 900° C., more typically from about 640° C. to about 700° C., to diffuse the aluminum into the substrate and form an aluminide coating on the external and internal surfaces of the blade. Depending on the temperature and composition of the blade and the coating, this step may occur over a wide range in time, e.g., from about 10 minutes to about 24 hours, but typically from about 0.5 to about 10 hours, more typically from about 0.75 hours to about 2 hours.

The coated blade is then maintained at a temperature of from about 450° C. to about 1100° C., typically from about 550° C. to about 900° C., more typically from about 600° C. to about 800° C. (e.g., the blade is heated or allowed to cool to a temperature within that range), in the presence of oxygen to form the desired oxide protective coating on the external and internal surfaces of the blade. Heating may be accomplished in the coating container 84, in an air furnace as a separate step, or, more typically, during operation of the turbine engine. This oxidizing step may be performed in an air atmosphere, so that there is some formation of nitrides as well. The oxidizing step may also be performed in an oxygen-only atmosphere such as one containing from about 0.2 to about 1000 parts per million of oxygen. In a typical case, the step of oxidizing the blade includes heating the blade to a temperature within the above range, for a time of at least about 1 hour, typically at least about 2 hours.

While the above embodiments have been described in the context of coating turbine engine blades, the present invention can be used to form an aluminide coating on external and internal surfaces of various turbine engine components, including vanes, heat exchangers, tubes, and nozzles. Such turbine engine components typically have a fluid handling system of high aspect ratio, for example, a length to average diameter of at least about 10, generally at least about 15. If the aluminum coating gas is ducted into the internal cooling cavity of the turbine engine component, and especially if the coating gas is flowed at high rates, the component may have an aspect ratio up to about 1000, but typically from about 50 to about 500. Otherwise, the aspect ratio of the turbine engine component is generally less than about 50, typically less than about 25.

The following examples illustrate some embodiments of this invention, but should not be construed to be any sort of limitation on its scope. In the examples, the test blades and vanes are high-pressure gas turbine engine components made from a single crystal nickel-based superalloy, available by the trade name René® N5. The blades and vanes have an external surface and an internal cooling cavity defined by an internal surface connected to the external surface by cooling holes in the airfoil body portion of the blade and vanes.

EXAMPLE 1

A process of the present invention is used to form an aluminide coating to turbine blades in the coating container shown in FIG. 3. The blades are loaded into the coating container and heated to a temperature of about 270° C. A tri-n-butyl aluminum coating gas is then flowed into the coating container at a pressure of about 500 mtorr (about 6.8 kgf/m$^2$) for about 5 hours to force the aluminum coating vapors to flow around the blades and through the cooling holes and internal cooling cavities of the blades, thereby depositing an aluminum coating on the external and internal surfaces of the blades. Some of the aluminum coating gas is ducted into the dovetail portions of the blades so that the vapor flows through their internal cooling cavities and out their cooling holes. The thickness of the aluminum coating is controlled by the temperature, gas flow, and elapsed time of the gas flow. The coated blades are then heated in a vacuum to a temperature of about 670° C. for about 5 hours to form an aluminide coating on the external and internal surfaces of the blade. Thereafter, the blades are heated to a temperature of about 700° C. in the presence of oxygen to form an oxide protective coating on the external and internal surfaces of the blade.

The aluminide coating formed on the external surfaces in the airfoil body portion of the blades has a thickness of about 0.002–0.0025 inches (about 50.8–63.5 microns). An aluminide coating having a thickness of from about 0.001–0.0015 inches (about 25.4–38.1 microns) is also formed on the internal airfoil body surfaces of the blades. An aluminide coating having a thickness of from about 0.0005–0.0015 inches (about 12.7–38.1 microns) is also formed on the internal surfaces of the dovetail cavities (i.e., the root portions) of the blades.

EXAMPLE 2

A process of the present invention is used to form an aluminide coating to turbine vanes in the coating container shown in FIG. 3. The vanes are loaded into the coating container and heated to a temperature of about 450° C. A tri-n-butyl aluminum coating gas is then flowed into the coating container at a pressure of about 100 mtorr (about 1.4 kgf/m$^2$) for about 1 hour to force the aluminum coating vapors to flow around and through the vanes, thereby depositing an aluminum coating on the external and internal surfaces of the vanes. Some of the aluminum coating gas is ducted into the internal cooling cavities of the vanes so that the vapor flows through the cooling cavities and out the cooling holes. The thickness of the aluminum coating is controlled by the temperature, gas flow, and elapsed time of the gas flow. The coated vanes are then heated in a vacuum to a temperature of about 670° C. for about 1 hour to form an aluminide coating on the external and internal surfaces of the vanes. Thereafter, the vanes are heated to a temperature of about 700° C. in the presence of oxygen to form an oxide protective coating on the external and internal surfaces of the vanes.

The aluminide coating formed on the external and internal surfaces of the vanes has a thickness of about 1 micron.

Various embodiments of this invention have been described. However, this disclosure should not be deemed to be a limitation on the scope of the invention. Accordingly, various modifications, adaptations, and alternatives may occur to one skilled in the art without departing from the spirit and scope of the claimed invention.

What is claimed is:

1. A method for forming a controlled, relatively uniform aluminide coating on a turbine engine component having an external surface and an internal cavity defined by an internal surface that is connected to the external surface by at least one hole, the method being conducted in a vapor coating container having a hollow interior coating chamber, the method comprising the steps of:
    (a) loading the coating chamber with the component to be coated;
    (b) heating the loaded coating chamber to a temperature of from about 240° C. to about 450° C.;
    (c) flowing a tri-alkyl aluminum coating gas into the heated coating chamber at a pressure of from about 50 to about 2000 mtorr (about 0.68 to about 27 kgf/m$^2$) for from about 0.25 to about 4 hours to deposit an aluminum coating on the external and internal surfaces of the component; and then
    (d) heating the coated component in a a nonoxidizing atmosphere to a temperature of from about 500° C. to about 1100° C. to form an aluminide coating on the external and internal surfaces of the component,
    wherein the aluminide coating on the internal surface of the blade is less than about 0.003 inches (less than about 76.2 microns) thick in the airfoil body portion and less than about 0.0015 inches (less than about 38.1 microns) thick in the root portion.

2. The method of claim 1 wherein the aluminum coating gas is a tri-C$_{3-5}$ alkyl aluminum gas.

3. The method of claim 2 wherein the aluminum coating gas is tri-butyl aluminum gas.

4. The method of claim 1 wherein during step (b) the loaded coating chamber is heated at a temperature of from about 250° C. to about 300° C.

5. The method of claim 4 wherein during step (c), the tri-alkyl aluminum coating gas is flowed at a pressure of from about 250 to about 700 mtorr (about 3.4 to about 9.5 kgf/m$^2$) for from about 0.5 to about 2 hours.

6. The method of claim 5 wherein the aluminum coating gas is tri-C$_{3-5}$ alkyl aluminum gas.

7. The method of claim 6 wherein during step (d), the coated component is heated in a vacuum to a temperature of from about 640° C. to about 700° C.

8. The method of claim 7 further comprising a step (e) of maintaining the component at a temperature of from about 600° C. to about 800° C. in the presence of oxygen to form an oxide coating on the external and internal surfaces of the component.

9. The method of claim 1 further comprising a step (e) of maintaining the component at a temperature of from about 450° C. to about 1100° C. in the presence of oxygen to form an oxide coating on the external and internal surfaces of the component.

10. The method of claim 9 wherein the temperature during step (e) is from about 600° C. to about 800° C.

11. The method of claim 1 wherein the turbine engine component is a turbine engine blade having an external surface and an internal cooling cavity defined by an internal surface that is connected to the external surface by cooling holes.

12. The method of claim 1 wherein the aluminide coating on the external surface of the blade is from about 0.0015 to about 0.003 inches (from about 38.1 to about 76.2 microns) thick in the airfoil body portion.

13. The method of claim 12 wherein during step (c) the coating chamber is maintained at a temperature of from about 250° C. to about 300° C. while a tri-C$_{3-5}$ alkyl aluminum coating gas is flowed into the chamber at a pressure of from about 250 to about 700 mtorr (about 3.4 to about 9.5 kgf/m$^2$) for from about 0.5 to about 2 hours, and the temperature during step (d) is maintained at from about 600° C. to about 900° C.

14. The method of claim 13 wherein the pressure during step (c) is from about 450 to about 550 mtorr (about 6.1 to about 7.5 kgf/m$^2$), and the temperature during step (d) is from about 640° C. to about 700° C.

15. The method of claim 14 further comprising a step (e) of maintaining the component at a temperature of from about 600° C. to about 800° C. in the presence of oxygen to form an oxide coating on the external and internal surfaces of the component.

16. A method for forming a controlled, relatively uniform aluminide coating on a turbine engine blade having an external surface and an internal cooling cavity defined by an internal surface that is connected to the external surface by cooling holes, the method being conducted in a vapor coating container having a hollow interior coating chamber, the method comprising the steps of:
    (a) loading the coating chamber with the blade to be coated;
    (b) heating the loaded coating chamber to a temperature of from about 240° C. to about 450° C.;
    (c) flowing a tri-alkyl aluminum coating gas into the heated coating chamber at a pressure of from about 50 to about 2000 mtorr (about 0.68 to about 27 kgf/m$^2$) for from about 0.25 to about 4 hours to deposit an aluminum coating on the external and internal surfaces of the blade;
    (d) heating the coated blade in a nonoxidizing atmosphere to a temperature of from about 500° C. to about 1100° C. to form an aluminide coating on the external and internal surfaces of the blade; and then
    (e) maintaining the blade at a temperature of from about 450° C. to about 1100° C. in the presence of oxygen to form an oxide coating on the external and internal surfaces of the blade;
    wherein the aluminide coating on the internal surface of the blade is less than about 0.003 inches (less than about 76.2 microns) thick in the airfoil body portion and less than about 0.0015 inches (less than about 38.1 microns) thick in the root portion.

17. The method of claim 16 wherein the aluminum coating gas is a tri-C$_{3-5}$ alkyl aluminum gas.

18. The method of claim 17 wherein the aluminum coating gas is tri-butyl aluminum gas.

19. The method of claim 16 wherein, during each of steps (b) and (c), the loaded coating chamber is maintained at a temperature of from about 250° C. to about 300° C.

20. The method of claim 16 wherein during step (c) the coating gas is flowed at a pressure of from about 250 to about 700 mtorr (about 3.4 to about 9.5 kgf/m$^2$) for from about 0.5 to about 2 hours.

21. The method of claim 16 wherein during step (d) the coated blade is heated to a temperature of from about 600° C. to about 900° C. for from about 0.75 to about 2 hours.

22. The method of claim 16 wherein the temperature during step (e) is from about 600° C. to about 800° C.

23. The method of claim 22 wherein the aluminum coating gas is tri-$C_{3-5}$ alkyl aluminum gas.

24. The method of claim 23 wherein, during each of steps (b) and (c), the loaded coating chamber is maintained at a temperature of from about 250° C. to about 300° C.

25. The method of claim 24 wherein during step (c) the coating gas is flowed at a pressure of from about 450 to about 550 mtorr (about 6.1 to about 7.5 kgf/m$^2$) for from about 0.75 to about 1.5 hours.

26. The method of claim 25 wherein during step (d) the coated blade is heated to a temperature of from about 640° C. to about 700° C. for from about 0.75 to about 2 hours.

27. A method for forming a controlled, relatively uniform aluminide coating on a turbine engine blade having an external surface and an internal cooling cavity defined by an internal surface that is connected to the external surface by cooling holes, the method being conducted in a vapor coating container having a hollow interior coating the chamber the method comprising the steps of:

(a) loading the coating chamber with the blade to be coated;

(b) heating the loaded coating chamber to a temperature of from about 250° C. to about 300° C.;

(c) flowing a tri-alkyl aluminum coating gas into the heated coating chamber at a pressure of from about 450 to about 550 mtorr (about 6.1 to about 7.5 kgf/m$^2$) for from about 0.5 to about 2 hours to deposit an aluminum coating on the external and internal surfaces of the blade;

(d) heating the coated blade in a vacuum to a temperature of from about 640° C. to about 700° C. to form aluminide coating on the external and internal surfaces of the blade; and then (e) maintaining the blade at a temperature of from about 600° C. to about 800° C. in the presence of oxygen to form an oxide coating on the external and internal surfaces of the blade wherein the aluminide coating on the internal surface of the blade is less than about 0.003 inches (less than about 76.2 microns) thick in the airfoil body portion and less than about 0.0015 inches (less than about 38.1 microns) thick in the root portion.

28. The method of claim 27 wherein the aluminum coating gas is tri-butyl aluminum gas.

29. The method of claim 28 wherein the aluminide coating has a thickness of from about 0.0015 to about 0.003 inches (from about 38.1 to about 76.2 microns) on the external surface of the blade in the airfoil body portion, and has a thickness of from about 0.0005 to about 0.0015 inches (from about 12.7 to about 38.1 microns) on the internal surface of the blade.

* * * * *

UNITED STATES PATENT AND TRADEMARK OFFICE
CERTIFICATE OF CORRECTION

PATENT NO. : 6,905,730 B2
DATED : June 14, 2005
INVENTOR(S) : Ackerman et al.

It is certified that error appears in the above-identified patent and that said Letters Patent is hereby corrected as shown below:

Column 12,
Line 1, delete "tri-alkyl" and insert -- tri-C2-C5 alkyl --.
Line 8, add -- an -- after "form".

Signed and Sealed this

Tenth Day of January, 2006

JON W. DUDAS
*Director of the United States Patent and Trademark Office*